(12) United States Patent
Hayashi et al.

(10) Patent No.: US 7,936,070 B2
(45) Date of Patent: May 3, 2011

(54) SEMICONDUCTOR DEVICE AND METHOD FOR FABRICATING SEMICONDUCTOR DEVICE

(75) Inventors: Yumi Hayashi, Kanagawa (JP); Noriaki Matsunaga, Kanagawa (JP); Takamasa Usui, Selkirk, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 168 days.

(21) Appl. No.: 12/435,485

(22) Filed: May 5, 2009

(65) Prior Publication Data

US 2009/0283913 A1 Nov. 19, 2009

(30) Foreign Application Priority Data

May 16, 2008 (JP) ................................. 2008-129819

(51) Int. Cl.
*H01L 23/48* (2006.01)
(52) U.S. Cl. ................ 257/762; 438/687; 257/E21.586; 257/E23.019
(58) Field of Classification Search .................. 257/762, 257/E21.586, E23.019; 438/687
See application file for complete search history.

(56) References Cited

U.S. PATENT DOCUMENTS

| 6,181,013 | B1 * | 1/2001 | Liu et al. ........................ 257/762 |
| 7,718,548 | B2 * | 5/2010 | Lee et al. ....................... 438/775 |
| 2005/0194683 | A1 * | 9/2005 | Yu et al. ......................... 257/738 |
| 2006/0211235 | A1 | 9/2006 | Usami |
| 2007/0018329 | A1 | 1/2007 | Oh et al. |
| 2007/0123043 | A1 * | 5/2007 | Streck et al. .................. 438/687 |

FOREIGN PATENT DOCUMENTS

| JP | 2006-261440 | 9/2006 |
| JP | 2007-27769 | 2/2007 |

OTHER PUBLICATIONS

U.S. Appl. No. 12/652,204, filed Jan. 5, 2010, Hayashi et al.

* cited by examiner

*Primary Examiner* — Trung Dang
(74) *Attorney, Agent, or Firm* — Oblon, Spivak, McClelland, Maier & Neustadt, L.L.P.

(57) ABSTRACT

A semiconductor device includes: a copper (Cu) wire having a first region and a second region in which densities of silicon (Si) and oxygen (O) atoms are higher than in the first region; a compound film that is selectively formed on the Cu wire and contains Cu and Si; and a dielectric film formed on a side surface side of the Cu wire.

20 Claims, 9 Drawing Sheets

SEMICONDUCTOR DEVICE AND METHOD FOR FABRICATING SEMICONDUCTOR DEVICE

CROSS-REFERENCE TO RELATED APPLICATION

This application is based upon and claims the benefit of priority from prior Japanese Patent Application No. 2008-129819 filed on May 16, 2008 in Japan, the entire contents of which are incorporated herein by reference.

BACKGROUND

When forming a multilayer interconnection in a semiconductor integrated circuit (LSI), a metal cap film may selectively be formed on a Cu wire to prevent diffusion of copper (Cu) or Cu alloys (hereinafter, referred to together as Cu) used as a wire material into a low-k film in an upper layer and also to improve adhesion properties of the low-k film. Such a metal cap technology is expected to be needed in the future in preparation for higher performance of a multilayer interconnection. A major candidate material of a metal cap film is a CuSiN film, which is a compound film of Cu, silicon (Si) and nitrogen (N) or a CuSix film, which is a silicide film with Cu (see Published Unexamined Japanese Patent Application (JP-A) No. 2006-261440 or JP-A-2007-27769, for example). The CuSiN film and CuSix film are excellent, as described above, in terms of barrier properties against Cu and therefore can achieve the effect of suppressing transport of Cu atoms on the Cu surface. Accordingly, electromigration characteristics can be improved. On the other hand, however, problems related to higher wire resistance arise.

BRIEF SUMMARY OF THE INVENTION

In accordance with one aspect of the present invention, a semiconductor device includes: a copper (Cu) wire having a first region and a second region in which densities of silicon (Si) and oxygen (O) atoms are higher than in the first region; a compound film that is selectively formed on the Cu wire and contains Cu and Si; and a dielectric film formed on a side surface side of the Cu wire.

In accordance with another aspect of this invention, a method for fabricating a semiconductor device, includes: forming a dielectric film above a substrate; forming an opening in the dielectric film; depositing a first copper (Cu) film up to some midpoint in the opening; forming a Cu oxide film on the first Cu film before the opening being filled completely with the first Cu film; forming a second Cu film above the Cu oxide film; and forming a compound film containing Cu and silicon (Si) selectively on the second Cu film.

In accordance with a further aspect of the invention, a method for fabricating a semiconductor device, includes: forming a dielectric film above a substrate; forming an opening in the dielectric film; depositing a copper (Cu) film in the opening; implanting oxygen (O) in the Cu film; and forming a compound film containing Cu and silicon (Si) selectively on the Cu film after O being implanted.

DETAILED DESCRIPTION OF THE INVENTION

In the embodiments shown below, both a semiconductor device in which excessive Si of a compound film formed on a Cu wire and that contains Cu and Si is prevented from diffusing into the Cu wire and a method for fabricating thereof will be described. In a conventional semiconductor device using CuSiN as a metal cap, excessive Si when CuSiN or CuSix is formed or Si that does not form Cu silicide penetrates into the Cu wire through a crystal grain boundary present on the surface of Cu wire due to the heating process and, after passing through the crystal grain boundary, diffuses into the Cu wire. Then, Si that diffuses after passing through the crystal grain boundary further diffuses from the crystal grain boundary of Cu into the Cu wire. As a result, wire resistance is increased as compared with a Cu wire in which the CuSiN film or CuSix film is not formed. Comparison of resistance shows an example of an increase in wire resistance of a Cu wire by almost 1.5 times. Since the amount of Si necessary for Si diffused uniformly in Cu to increase wire resistance by 1.5 times is a small amount of 0.25 at %, it is difficult to adjust the amount of Si in the formation process of a CuSiN film or CuSix film. Thus, it is necessary to prevent Si from diffusing through a Cu grain boundary into Cu by certain techniques.

Embodiment 1

In the embodiment 1, a semiconductor device in which a layer for trapping excessive Si is formed in a step of forming a Cu film and Si is trapped by the trap layer and a method for fabricating thereof will be described. The embodiment 1 will be described below using drawings.

Figure 1:
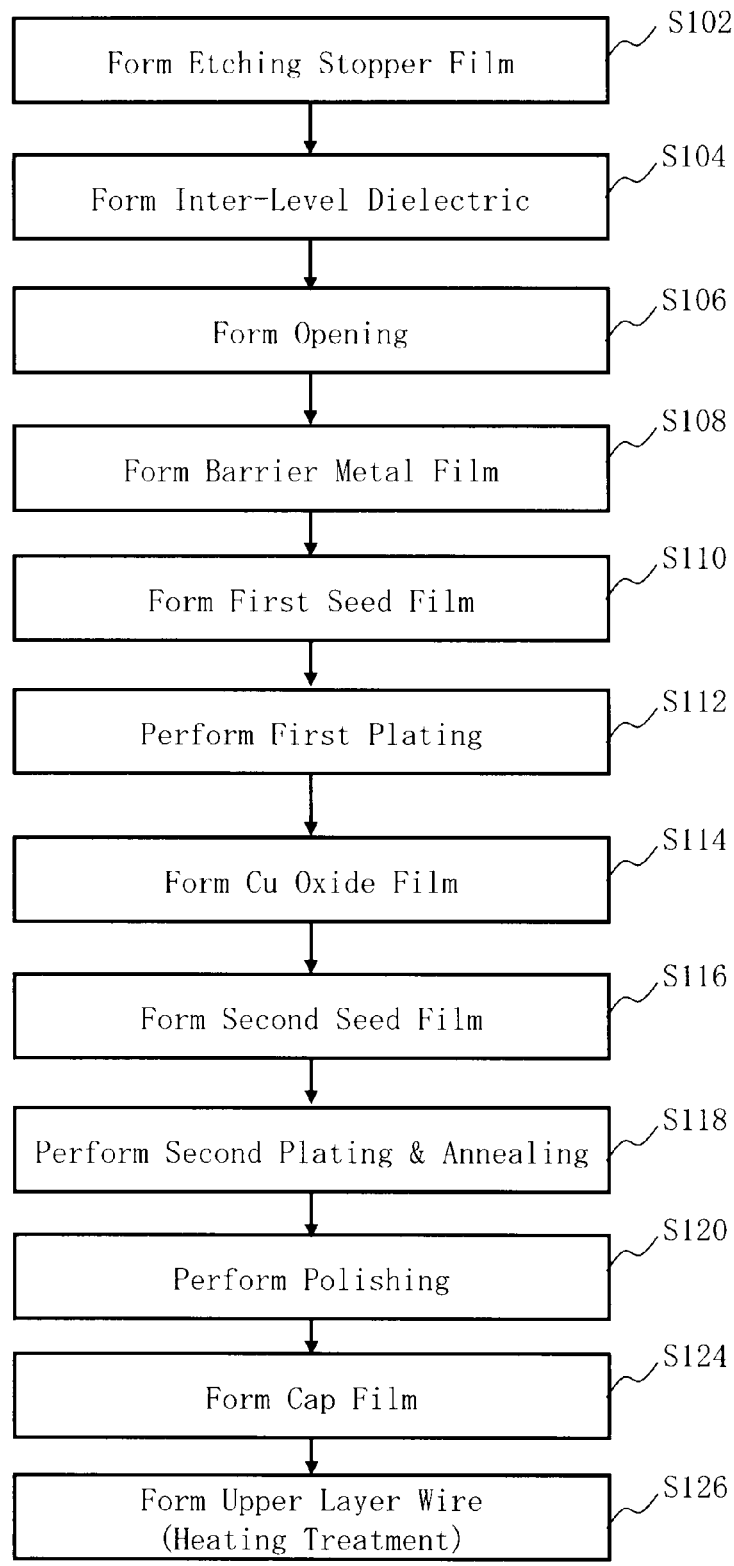
FIG. 1 is a flow chart showing parts of a method for fabricating a semiconductor device in an embodiment 1.

FIG. 1 is a flow chart showing parts of a method for fabricating a semiconductor device in the embodiment 1. In FIG. 1, a series of processes including an etching stopper film formation process (S102), inter-level dielectric formation process (S104), opening formation process (S106), barrier metal film formation process (S108), first seed film formation process (S110), first plating process (S112), Cu oxide film formation process (S114), second seed film formation process (S116), second plating & annealing process (S118), polishing process (S120), cap film formation process (S124), and upper layer wire formation process (S126) are performed in the present embodiment.

FIG. 2A to FIG. 2D, FIG. 3A to FIG. 3D, and FIG. 4A to FIG. 4D are process sectional views showing processes performed corresponding to the flow chart in FIG. 1. FIG. 2A to FIG. 2D show the etching stopper film formation process (S102) to the barrier metal film formation process (S108) in FIG. 1. Processes thereafter will be described later.

Figure 2A:
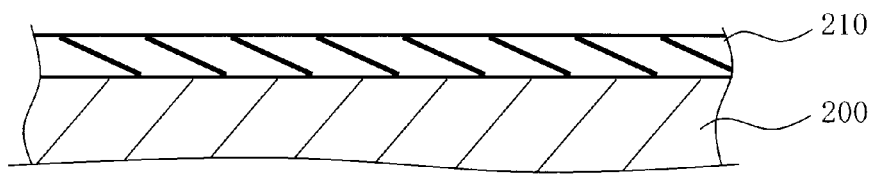
FIG. 2A to FIG. 2D are process sectional views showing processes performed corresponding to the flow chart in FIG. 1.

In FIG. 2A, as the etching stopper film formation process (S102), an etching stopper film 210 of, for example, the thickness of 50 nm on the surface of a substrate 200 by the CVD (Chemical Vapor Deposition) method. Silicon nitride (SiN), silicon carbonitride (SiCN), or silicon oxinitride (SiON) can suitably be used as a material of the etching stopper film 210. A silicon wafer of 300 mm in diameter, for example, is used as the substrate 200. Here, the illustration of a device portion is omitted. Wires or other circuits may further be formed on the substrate 200. The etching stopper film formation process (S102) may be performed, but may also be omitted.

Figure 2B:
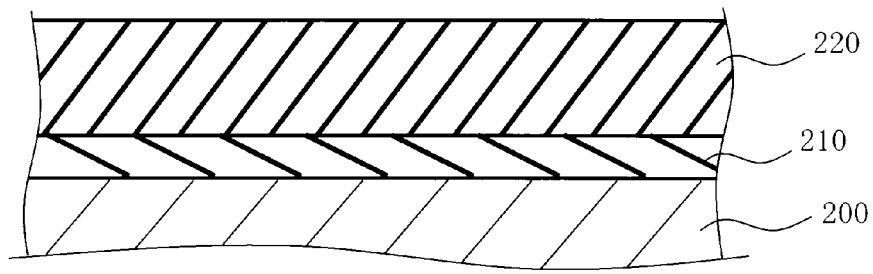

In FIG. 2B, as the inter-level dielectric formation process (S104), an inter-level dielectric 220 in a wiring layer is formed on the etching stopper film 210 formed on the substrate 200 to a thickness of, for example, 150 nm. An $SiO_2$ film or low-k-film is suitably used as the inter-level dielectric 220. Particularly, if a low-k film using a porous low dielectric constant material is used for the inter-level dielectric 220, an inter-level dielectric whose relative dielectric constant is lower than 3.5 can be obtained. For example, a low-k film is formed using a film having polymethyl siloxane that becomes a low dielectric constant material whose relative dielectric constant is lower than 2.5 as a component. In addition to polymethyl siloxane, a low-k film may be formed by using the material of at least one film selected from a group including a film having siloxane backbone structures such as polysiloxane, hydrogen silsesquioxane, and methyl silsesquioxane, a film having organic resin as a main component such as polyarylene ether, polybenzo oxazole, and polybenzo cyclobutene, and a porous film such as a porous silica film. A low dielectric constant of less than 2.5 can be obtained using such materials of a low-k film. As a formation method thereof, for example, the SOD (Spin On Dielectric coating) method by which a thin film is obtained by spin coating and heat treatment of a solution can be used. For example, a low-k film can be formed by forming a wafer by a spinner, baking the wafer on a hot plate in a nitrogen atmosphere, and finally curing the wafer on the hot plate at a temperature higher than the baking temperature in the nitrogen atmosphere. A porous dielectric film having predetermined property values can be obtained by appropriately adjusting the low-k material and formation conditions. Alternately, a low-k film may be formed by the CVD method. When an $SiO_2$ film is formed as the inter-level dielectric 220, the CVD method is suitably used to form the inter-level dielectric 220.

When a low-k film is formed as the inter-level dielectric 220, a cap dielectric film (not shown) is suitably formed to configure a two-layer structure. For example, a cap dielectric film may be formed by the CVD method. By forming a cap dielectric film, a low-k film with weak mechanical strength can be protected. A cap dielectric film is suitably formed by using at least one dielectric material whose relative dielectric constant is equal to or higher than 2.5 selected from a group including silicon carboxide (SiOC), TEOS (tetraethoxy silane), SiC, silicon carbohydrate (SiCH), silicon carbonitride (SiCN), and SiOCH. Methods other than the CVD method may also be used as the formation method.

Figure 2C:
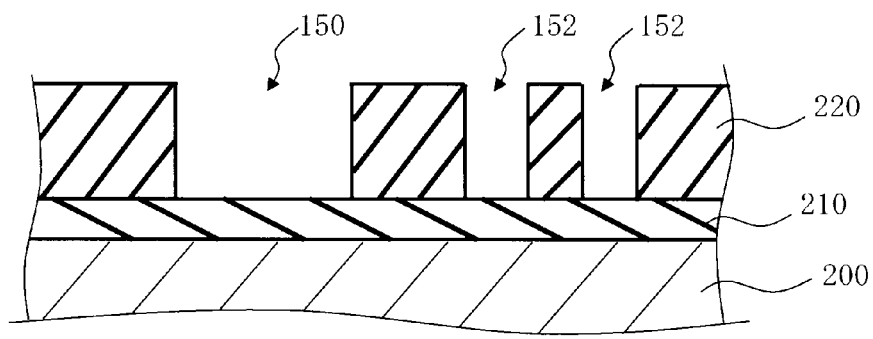

In FIG. 2C, as the opening formation process (S106) openings 150 and 152, which are wire groove structures that produce a damascene wire in lithography and dry etching processes, in the inter-level dielectric 220. The openings 150 and 152 may be formed by removing the exposed inter-level dielectric 220 from the substrate 200 with a resist film formed on the inter-level dielectric 220 by undergoing the lithography process, such as a resist application process and exposure process, by the anisotropic etching method using the etching stopper film 210 as an etching stopper. By using the anisotropic etching method, the openings 150 and 152 can be formed substantially perpendicularly to the surface of the substrate 200. For example, the openings 150 and 152 may be formed by the reactive ion etching method. Here, wires of at least two wire widths are formed in the same layer. Thus, a plurality of openings with different widths is formed together so that at least two opening widths for wires of at last two wire widths can be obtained. In FIG. 2C, particularly the opening 150 for a broad wire and the opening 152 for a narrow wire are illustrated.

Figure 2D:
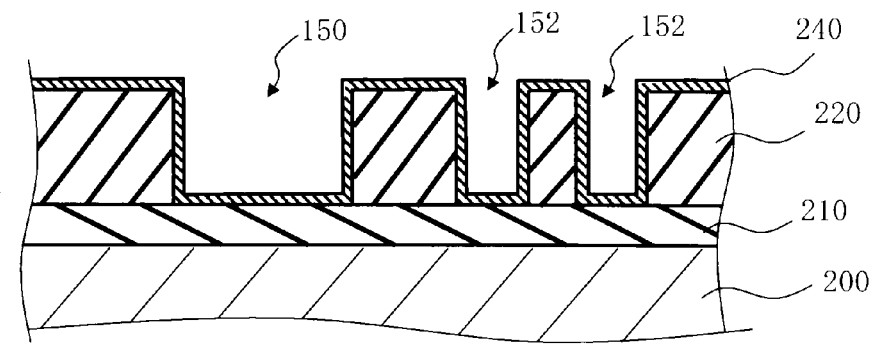

In FIG. 2D, as the barrier metal film formation process (S108), a barrier metal film 240 using a barrier metal material is formed in the openings 150 and 152 formed by the opening formation process and on the surface of the inter-level dielectric 220. A tantalum (Ta) film is deposited to a thickness of, for example, 10 nm in a sputtering device using the sputter process, which is a kind of the physical vapor deposition (PVD) method, to form the barrier metal film 240. The deposition method of barrier metal material is not limited to the PVD method and the atomic layer deposition (ALD) method (or the atomic layer chemical vapor deposition (ALCVD) method) and the CVD method can also be used. The coverage factor can be improved when compared with the PVD method. In addition to Ta, materials of a barrier metal film include titanium (Ti), tantalum nitride (TaN), tungsten (W), titanium nitride (TiN), tungsten nitride (WN), and laminated film combining these materials such as Ta and TaN.

FIG. 3A to FIG. 3D show the first seed film formation process (S110) to the second seed film formation process (S116) in FIG. 1.

Figure 3A:
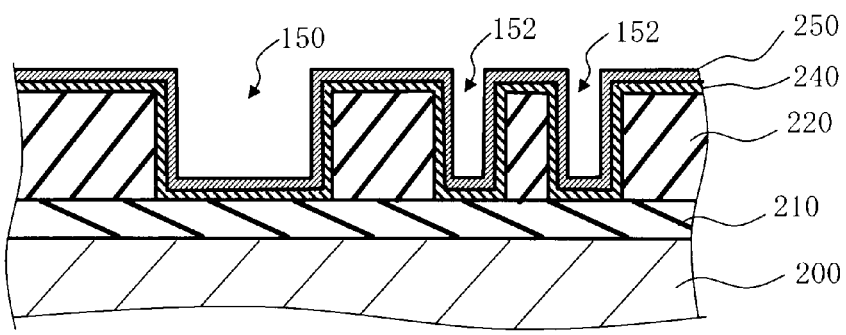
FIG. 3A to FIG. 3D are process sectional views showing processes performed corresponding to the flow chart in FIG. 1.

In FIG. 3A, as the first seed film formation process (S110), a Cu thin film to be a cathode electrode in the next process, the first electro-plating process, is deposited (formed) by the physical vapor deposition (PVD) method such as the sputter process as a seed film 250 on inner walls and at the bottom of the openings 150 and 152 in which the barrier metal film 240 is formed and on the surface of the substrate 200. Here, the seed film 250 is formed to a thickness of, for example, 50 nm.

Figure 3B:
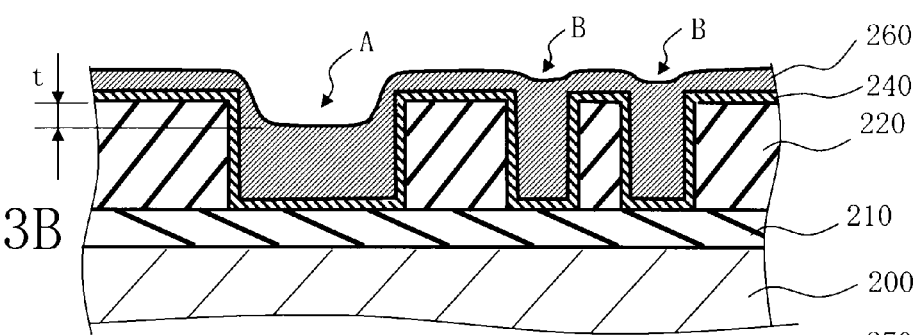

In FIG. 3B, as the first plating process (S112), a thin film of a Cu film 260 is deposited in the openings 150 and 152 and on the surface of the substrate 200 by an electrochemical growth method such as electro-plating using the seed film 250 as the cathode electrode. Here, plating is temporarily stopped before the opening 150 for a broad wire A is completely embedded. For example, the Cu film 260 is deposited or embedded in the opening 150 in such a way that the thickness t from the surface of the broad wire A is not embedded. The thickness t is suitably set at 30% or less of the thickness of the broad wire A. In this manner, the Cu film 260 is deposited, or embedded up to some midpoint in the opening 150. On the other hand, the opening 152 for a narrow wire is completely embedded. Since the opening width of the opening 150 is broader than that of the opening 152, the state before the opening 150 is completely embedded can be created even after the opening 152 is completely embedded.

Figure 3C:
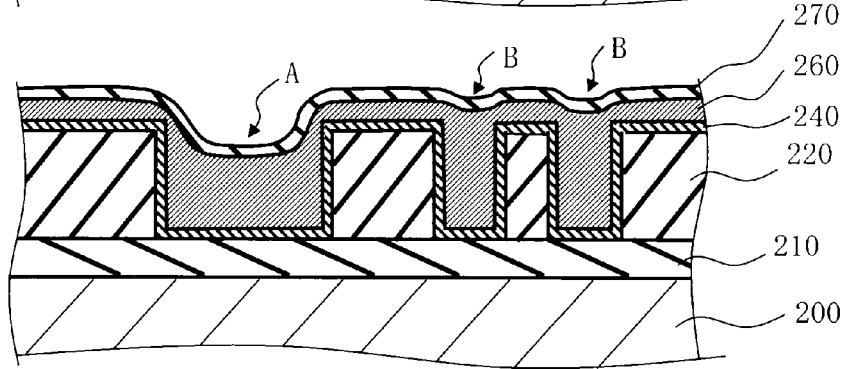

In FIG. 3C, as the Cu oxide film formation process (S114), a Cu oxide film (Cu—O film) 270 is formed on the surface of the Cu film 260 as the Cu oxide film formation process (S114). For example, a natural oxide film Cu—O of 2 to 3 nm in thickness is formed on the surface of the Cu film 260 by being left to the air. Alternately, the Cu oxide film 270 may be formed by soaking the substrate 200 in a liquid containing oxygen ($O_2$) (or O) to expose the surface of the Cu film 260 to $O_2$. Alternately, the Cu oxide film 270 may be formed by putting the substrate 200 into a gas atmosphere containing $O_2$ (or O) to expose the surface of the Cu film 260 to $O_2$. The Cu oxide film 270 formed in the opening 150 will be a trap layer to trap Si. Thus, the depth of plating to be deposited or embedded in the opening 150 may be decided depending on the depth position of the trap layer to be formed in the aforementioned first plating process (S112). Here, the opening 152 is completely filled with Cu film 260 and thus, while the Cu oxide film 270 is formed in the opening 150, the Cu oxide film 270 is not formed in the opening 152.

Figure 3D:
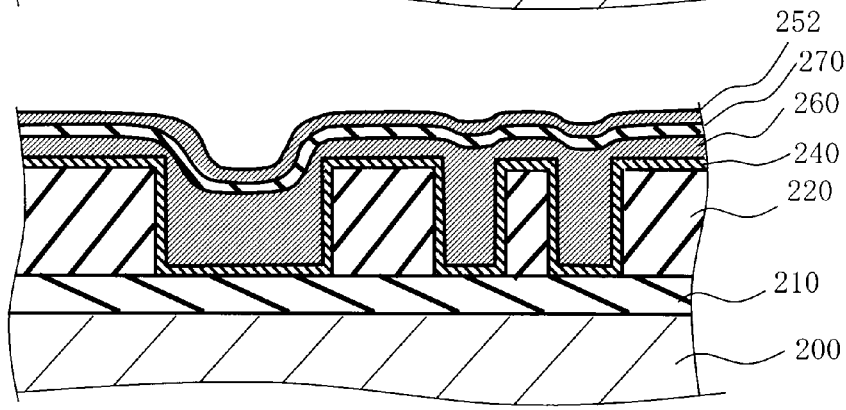

In FIG. 3D, as the second seed film formation process (S116), a Cu thin film to be a cathode electrode in the next process, the second electro-plating process, is deposited (formed) by the physical vapor deposition (PVD) method such as the sputter process as a seed film 252 on the surface of the Cu oxide film 270 in the opening 150 and other portions of the substrate 200. Here, the seed film 252 is formed to a thickness of, for example, 50 nm. Since the Cu oxide film 270 is a dielectric film, a cathode electrode in the next process, the second electro-plating process, can reliably be formed by forming the seed film 252. However, depending on the thickness of the Cu oxide film 270, a current during plating may flow without the seed film 252 being formed. In such cases, the second seed film formation process (S116) may be omitted.

FIG. 4A to FIG. 4D show the second plating process (S118) to the upper layer wire formation process (S126) in FIG. 1.

Figure 4A:
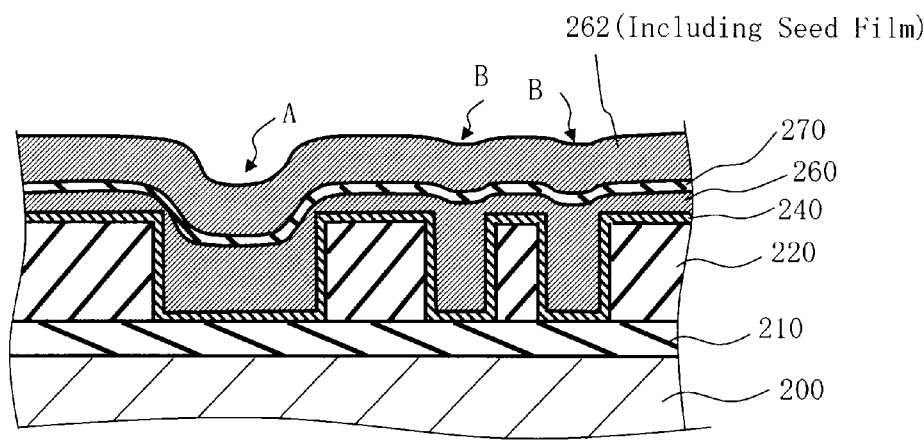
FIG. 4A to FIG. 4D are process sectional views showing processes performed corresponding to the flow chart in FIG. 1.

In FIG. 4A, as the second plating & annealing process (S118), a thin film of a Cu film 262 is deposited in the opening 150 and on the surface of other portions of the substrate 200 by the electrochemical growth method such as electro-plating using the seed film 250 or the Cu film 260 as a cathode electrode. The opening 150 is thereby completely filled with the Cu film 262. Then, after the Cu film 262 being deposited, annealing is performed, for example, at 250° C. for 30 min.

Here, the method for filling the remaining portion of the opening 150 with Cu after the Cu oxide film 270 being formed is not limited to the electro-plating, and the sputter process, PVD method, or CVD method may also be used.

Figure 4B:
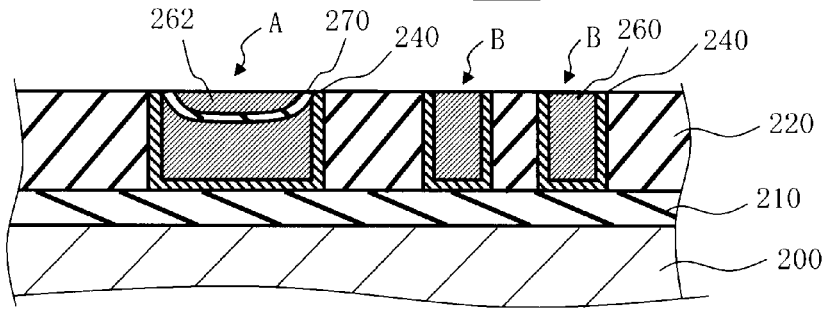

In FIG. 4B, as the polishing process (S120), the excessive Cu films 260 and 262, the excessive Cu oxide film 270, and the excessive barrier metal film 240 projecting from the openings 150 and 152 of the substrate 200 are polished by the CMP method for planarization. Accordingly, the broad-width Cu wire A and minimum-width Cu wires B shown in FIG. 4B can be formed.

Figure 4C:
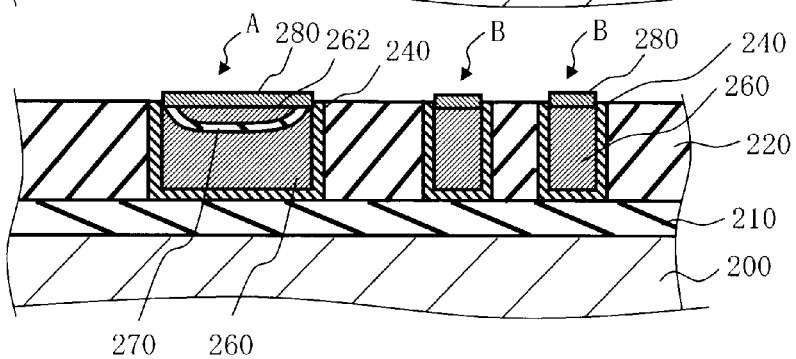

In FIG. 4C, as the cap film formation process (S124) a selective cap film 280 is selectively formed in portions where Cu is exposed. For example, a CuSiN film, which is a compound film of Cu, silicon (Si) and nitrogen (N) or a CuSix film, which is a silicide film of Cu, is suitably formed as the selective cap film 280. A CuSiN film or CuSix film can be formed as described below. A silane ($SiH_4$) gas and an ammonium ($NH_3$) gas are supplied into a reaction vessel in which the substrate 200 is placed so that the surface of the exposed Cu films 260 and 262 is selectively reformed. More specifically, after the Cu wires are formed, an oxide film on the surface of the exposed Cu films 260 and 262 is reduced by a thermal reaction using $NH_3$ plasma or $NH_3$ to remove the oxide film. The surface of the exposed Cu films 260 and 262 is then exposed by an Si containing gas in the $SiH_4$ gas to diffuse Si into Cu. CuSix can thereby be formed. A CuSiN film can then be formed by further forming Si—N bonds on the surface of the exposed Cu films 260 and 262 in this state. A CuSiN film is formed with the thickness of, for example, 5 nm. By forming a CuSiN film or CuSix, diffusion of Cu into a dielectric film can be suppressed. Here, when an oxide film on the surface of the Cu films 260 and 262 is reduced by $NH_3$ plasma treatment, the treatment is suitably performed in an $NH_3$ gas atmosphere for 15 to 30 s by setting the substrate temperature to between 250° C. and 400° C. When an oxide film on the surface of the Cu films 260 and 262 is reduced by a thermal reaction using $NH_3$, the treatment is suitably performed in an $NH_3$ gas atmosphere for 15 to 120 s by setting the substrate temperature to between 250° C. and 400° C. By reducing an oxide film under such conditions, Cu—O on the surface of the Cu film can be reduced while preventing reduction of the Cu oxide film 270.

Figure 4D:
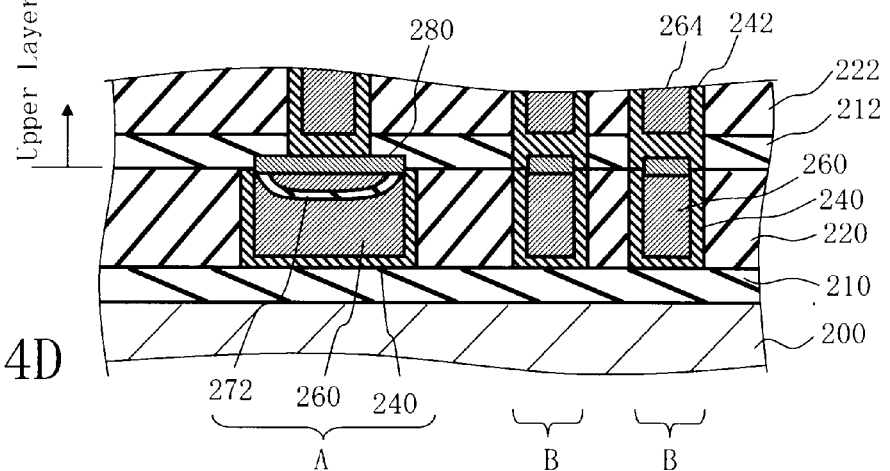

In FIG. 4D, as the upper layer wire formation process (S126), upper layer wires are further formed on the Cu wires. Here, for example, an etching stopper film 212 is formed on the Cu wires where the selective cap film 280 is formed and other portions of the substrate 200. A film similar to the etching stopper film 210 may be used as the etching stopper film 212. Then, an inter-level dielectric 222 is formed on the etching stopper film 212. A film similar to the inter-level dielectric 220 may be used as the inter-level dielectric 222. Openings are then formed in the inter-level dielectric 222 and a barrier metal 242 is formed on the inner walls and at the bottom of the openings. Then, the remaining space in the openings is filled with a Cu film 264. Upper layer wires can be formed by the procedure described above. FIG. 4D shows only the lower side, which is a portion of the upper layer wire layer.

Figure 5:
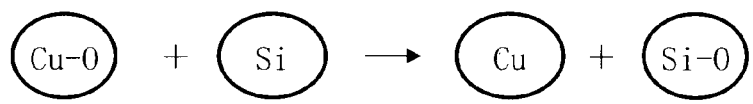
FIG. 5 is a conceptual diagram illustrating an Si trap technique in the embodiment 1.
Figure 5:
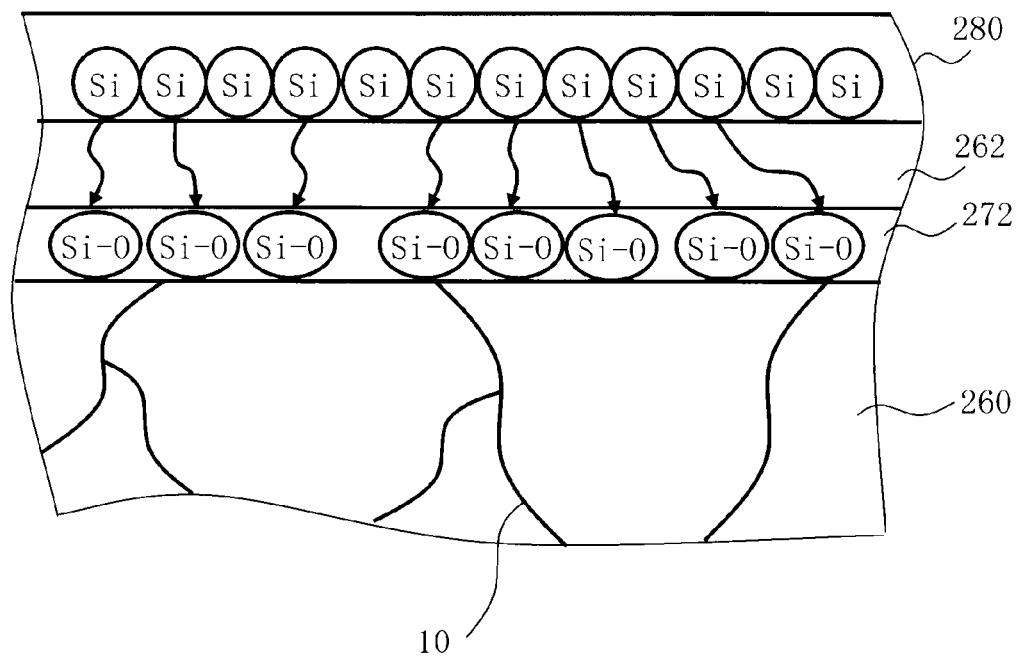

FIG. 5 is a conceptual diagram illustrating an Si trap technique in the embodiment 1. In FIG. 5, the Cu oxide film 270 to be a trap layer of Si is formed near the surface of the Cu wire within 30% of the film thickness from the Cu surface, for example, within 50 nm. The layer of the Cu oxide film 270 has Cu—O bonds and is positioned on the upper layer side inside the Cu wire, in particular near the surface thereof. On the other hand, excessive Si when the selective cap film 280 such as CuSiN or CuSix is formed is present near the surface of the Cu film 262.

Here, excessive Si when the selective cap film 280 is formed is diffused into the Cu film 260 by heating treatment generated in one of a series of processes in the upper layer wire formation process (S126). Si enters the Cu wire 260 from the crystal grain boundary of Cu present in the interface between the Cu wire 260 and the selective cap film 280 and diffuses into the Cu wire 260 after passing through the crystal grain boundary. In the embodiment 1, however, the Cu oxide film 270 to be an Si trap layer is formed between the Cu film 260 and the Cu film 262. Si that has passed through the crystal grain boundary of the Cu film 262 is trapped by the Cu oxide film 270. When Si moves to the Cu oxide film 270 having Cu—O bonds, a reduction reaction of Cu—O occurs, forming Si—O bonds. For example, Si—O bonds are formed by heating treatment from between 200° C. and 400° C. in the upper layer wire formation. According to an Ellingham diagram, the bonding force of Si—O is stronger than that of Cu—C and Cu—C is reduced by Si to stabilize as Si—O. Thus, as shown in FIG. 5, the Cu oxide film 270 stabilizes by a portion or the whole thereof by being changed to a region 272 containing a large quantity of Si—O bonds. Thus, diffusion of Si into the Cu film 260 below the crystal grain boundary of the Cu film 260 present between the region 272 and the Cu film 260 can be suppressed.

As described above, the amount of Si necessary for Si diffused into Cu to increase wire resistance by up to 1.5 times is 0.25 at %. The amount of O necessary to trap the Si is also 0.25 at %. Here, while the limit of identification when O is detected by using EELS is 0.5 at %, the amount of O in the Cu wire when the selective cap film 280 is not formed is equal to or less than 0.5 at % of the limit of identification. Thus, Si that diffuses can sufficiently be trapped by an amount of O of at least 0.5 at % being made to be present as a trap layer. Thus, the Cu oxide film 270 is suitably formed in such a way that the amount of O in the film is 0.5 at % or more.

As shown in FIG. 4D, the upper surface of the Cu film 260 is covered with the region 272. While a portion of the Cu film 260, for example, a portion of the wire on the side surface side, may not be covered with the region 272, it is preferable that the Cu film 260 be covered with the Cu oxide film 270 and the region 272, as shown in FIG. 4C and FIG. 4D, to prevent an increase in resistance due to diffusion of Si.

If, as shown in FIG. 4C and FIG. 4D, the Cu oxide film 270 and the region 272 are positioned above the wire A, the volume of the Cu film 260 increases so that an increase in wire resistance can be prevented.

If, for example, the Cu oxide film 270 and the region 272 are positioned on the lower layer side, the volume of the Cu film 262 into which diffusion of Si is prevented increases relatively compared with the Cu film 260 and the resistance of the wire A as a whole increases and thus, it is preferable that the Cu oxide film 270 and the region 272 be positioned on the upper layer side.

In the present embodiment, the broad-width Cu wire A having the region 272 in which more Si and O are contained than in other regions and the minimum-width Cu wire B (second Cu wire) formed in the same layer as the broad-width Cu wire A, having a narrower width than the broad-width Cu wire A, and having with no region 272, are provided. In the present embodiment, as described above, the Cu oxide film 270 is formed in the Cu wire only in the broad-width Cu wire A. An increase in wire resistance is a problem that prominently arises only in the broad wire, and the narrow wire does not necessarily need a trap layer. In the minimum-width Cu wire B, the number of tips of the crystal grain boundary of the Cu film is smaller compared with that of the broad-width Cu wire A due to narrow wire width. Thus, it is inherently difficult for Si to diffuse. Moreover, the minimum-width Cu wire B originally has a larger wire resistance than the broad-width Cu wire A, and is affected less even if Si diffuses. For these reasons, there is no need to form the Cu oxide film 270 in the minimum-width Cu wire B. Thus, there is no need to form the region 272 in which more Si and O are contained than in other regions in the minimum-width Cu wire B, either.

A semiconductor device according to the embodiment 1, as described above, includes the Cu layers 260 and 262 to be Cu wires, the selective cap film 280 selectively formed on the Cu wire that contains Cu and Si, and the inter-level dielectric 220 formed on the side surface side of the Cu wire. Then, the Cu wire of such a semiconductor device has the region 272 in which more Si and O are contained than in other regions by Si being trapped by the trap layer. A semiconductor device having the region 272 can prevent excessive Si of a compound film formed on the Cu film and containing Cu and Si from being diffused into the Cu wire.

Figure 6:
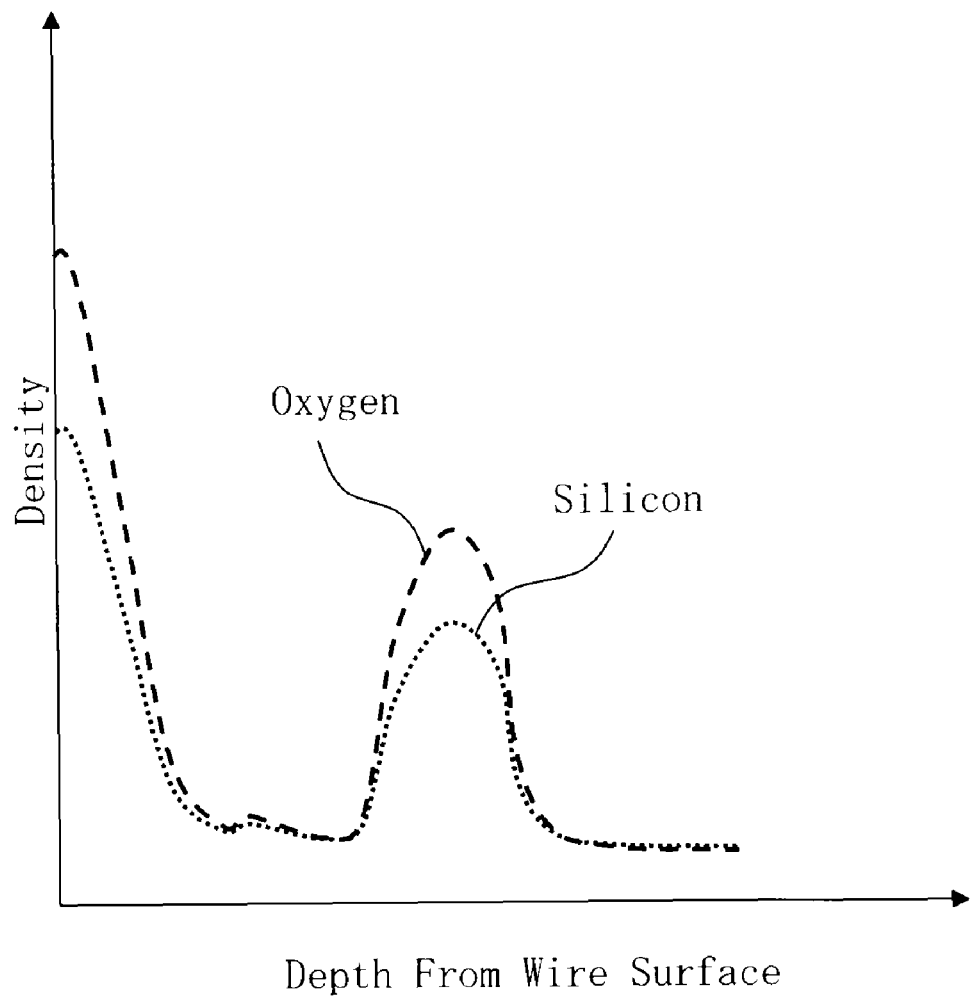
FIG. 6 is a graph showing a relationship between a depth from the surface of a Cu wire and densities of Si and O in the embodiment 1.

FIG. 6 is a graph showing a relationship between the depth from the surface of the Cu wire and densities of Si and O in the embodiment 1. As shown in FIG. 6, after amounts of Si and O present in the Cu film interface rapidly decrease in the Cu film, there is a region in which large amounts of Si and O are suddenly contained at a position slightly further below (position still deeper). Si and O are then not substantially present further below the region. Thus, excessive Si in the selective cap film 280 formed on the Cu wire can be prevented from being diffused into the Cu wire. Moreover, since Si—O bonds do not substantially increase wire resistance, the conventional problem of an increase in wire resistance of a Cu wire can be solved.

Embodiment 2

In an embodiment 2, a layer to trap excessive Si is formed in a step after planarization and formation of a Cu film and before a selective cap film is formed. A semiconductor device that traps Si by the trap layer and a method for fabricating thereof will be described. The embodiment 2 will be described below using drawings.

Figure 7:
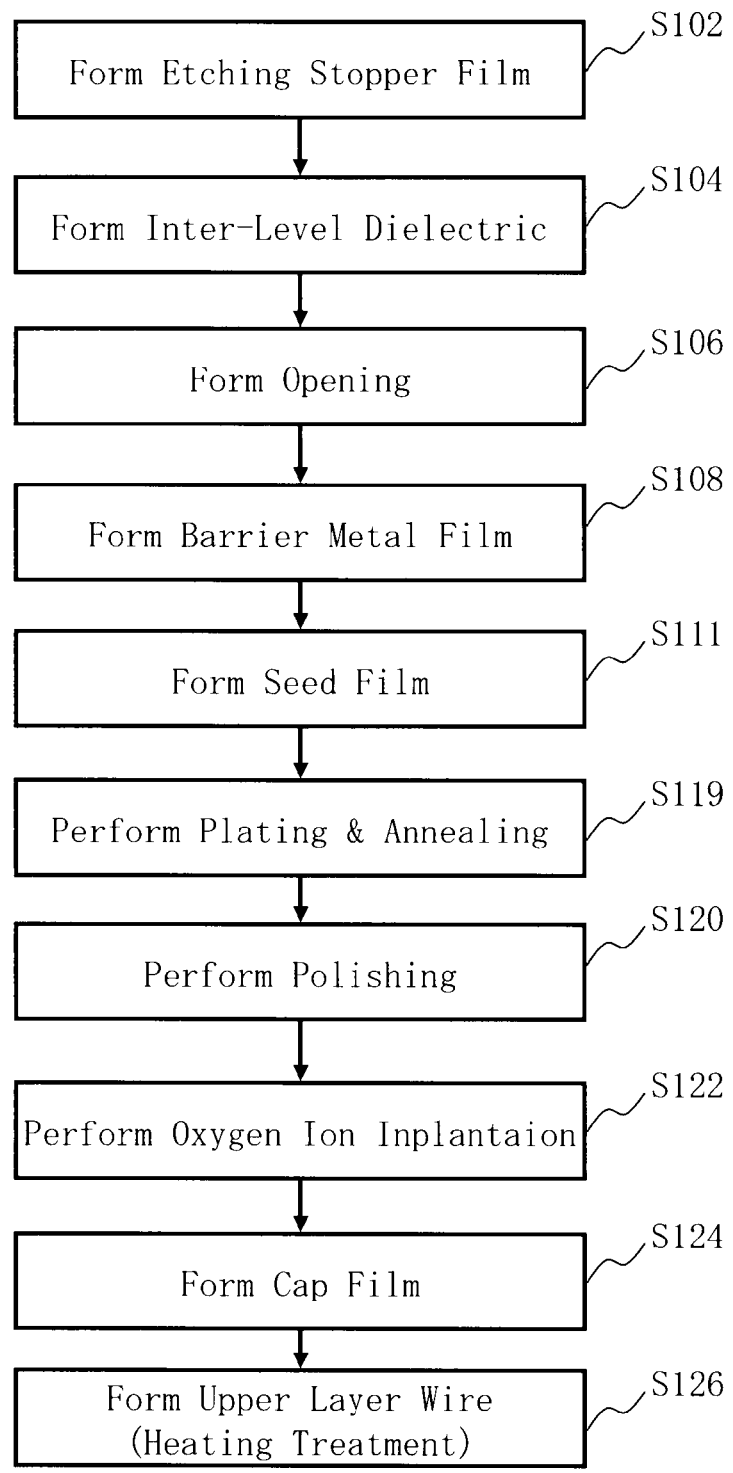
FIG. 7 is a flow chart showing principal parts of a method for fabricating a semiconductor device in an embodiment 2.

FIG. 7 is a flow chart showing principal parts of a method for fabricating a semiconductor device in the embodiment 2. FIG. 7 is the same as FIG. 1 except that a seed film formation process (S111) and a plating & annealing process (S119) are added in place of the first seed film formation process (S110), the first plating process (S112), the Cu oxide film formation process (S114), the second seed film formation process (S116), and the second plating & annealing process (S118), and an oxygen ion implantation process (S122) is added between the polishing process (S120) and the cap film formation process (S124). Content of the seed film formation process (S111) is the same as that of the first seed film formation process (S110). Thus, the content of each process from the etching stopper film formation process (S102) to the seed film formation process (S111) is the same as in the embodiment 1. Therefore, all processes up to the state in FIG. 3A are the same as in the embodiment 1.

Figure 8A:
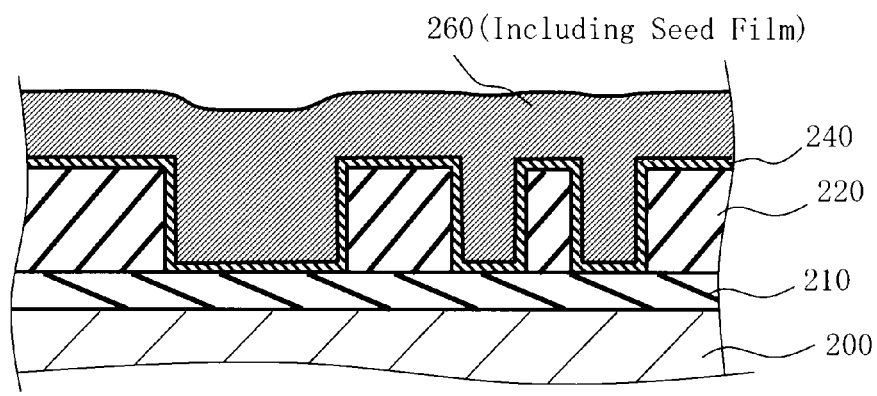
FIG. 8A to FIG. 8C are process sectional views showing processes performed corresponding to the flow chart in FIG. 7.
Figure 8B:
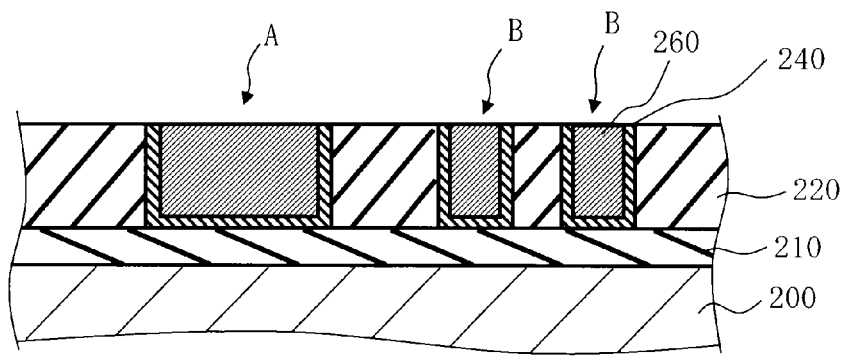
Figure 8C:
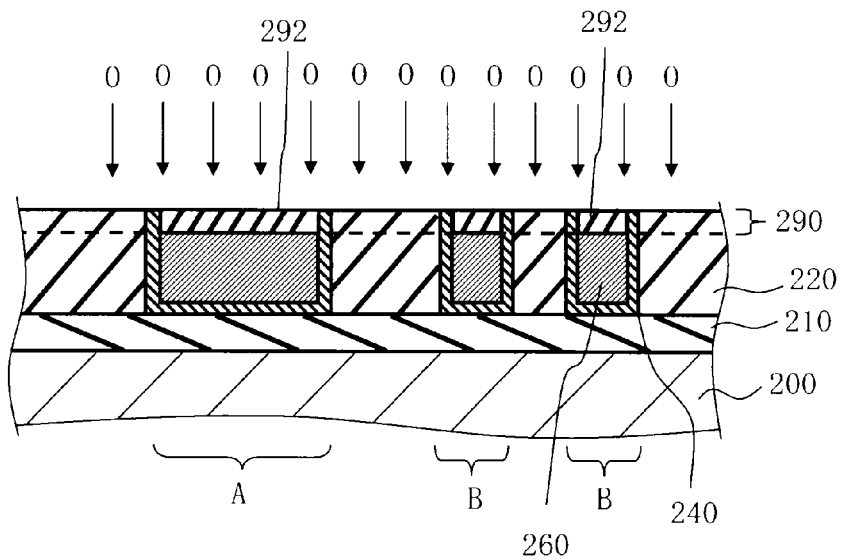

FIG. 8A to FIG. 8C and FIG. 9A and FIG. 9B are process sectional views showing processes performed corresponding to the flow chart in FIG. 7. FIG. 8A to FIG. 8C show the plating & annealing process (S119) to the oxygen ion implantation process (S122) of FIG. 7.

In FIG. 8A, as the plating & annealing process (S119), a thin film of the Cu film 260 is deposited in the openings 150 and 152 and on the surface of other portions of the substrate 200 by the electrochemical growth method such as electroplating using the seed film 250 as a cathode electrode. The openings 150 and 152 are thereby completely filled with the Cu film 260. Then, after the Cu film 260 being deposited, annealing is performed, for example, at 250° C. for 30 min.

In FIG. 8B, as the polishing process (S120), the excessive Cu films 260 and 262, the excessive Cu oxide film 270, and the excessive barrier metal film 240 projecting from the openings 150 and 152 of the substrate 200 are polished by the CMP method for planarization. Accordingly, the broad-width Cu wire A and the minimum-width Cu wires B shown in FIG. 8B can be formed.

In FIG. 8C, as the oxygen ion implantation process (S122), O ions are implanted in the Cu film 260 and the inter-level dielectric 220 from the surface of the Cu film 260 and also from the surface of the inter-level dielectric 220. An applied voltage of, for example, 10 eV can suitably be applied. With such an applied voltage, the implantation depth can be limited to within 30% of the thickness of the Cu film 260. FIG. 8C shows that O is implanted in a region 290. As a result, a region 292 in which more O is contained than in other regions is formed in the Cu film 260. In the region 292, Cu—O bonds are formed. Also here, as described above, the region 292 is suitably formed in such a way that the amount of O in the region is 0.5 at % or more.

Figure 9A:
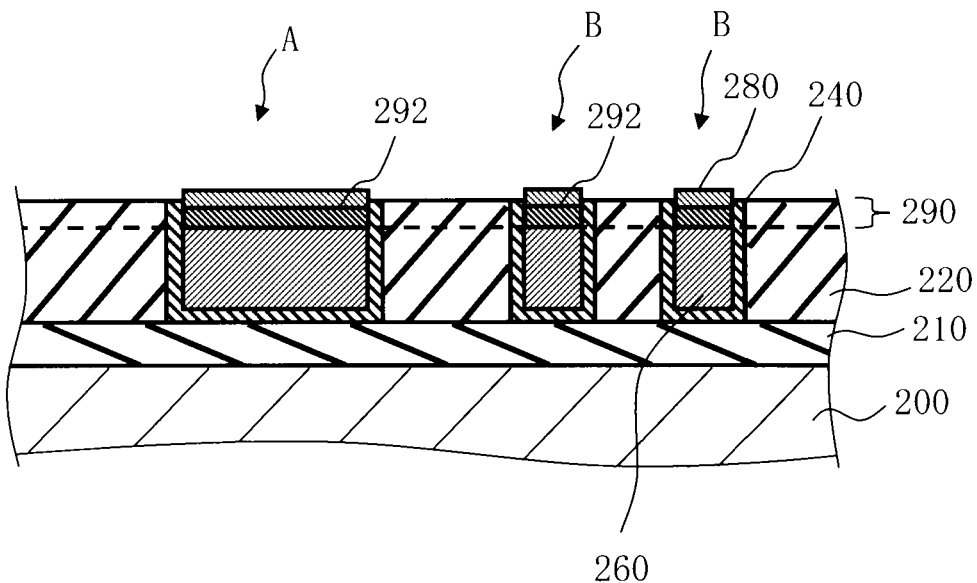
FIG. 9A and FIG. 9B are process sectional views showing processes performed corresponding to the flow chart in FIG. 7.
Figure 9B:
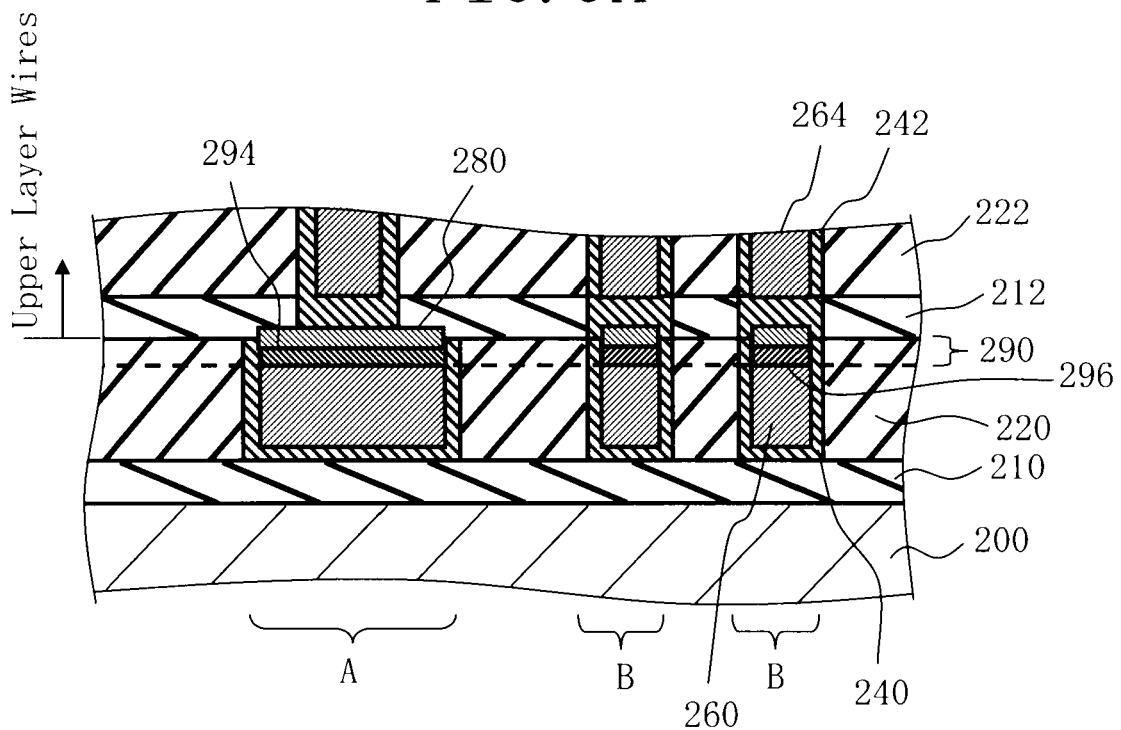

FIG. 9A and FIG. 9B show the cap film formation process (S124) and the upper layer wire formation process (S126) of FIG. 7.

In FIG. 9A, as the cap film formation process (S124) the selective cap film 280 is selectively formed in portions where Cu is exposed. As in the embodiment 1, for example, a CuSiN film or CuSix film can suitably be formed as the selective cap film 280. Also, the formation method is the same as in the embodiment 1. When an oxide film on the surface of the Cu films 260 and 262 is reduced by $NH_3$ plasma treatment, the treatment is suitably performed in an $NH_3$ gas atmosphere for 15 to 30 s by setting the substrate temperature between 250° C. and 400° C. When an oxide film on the surface of the Cu films 260 and 262 is reduced by a thermal reaction using $NH_3$, the treatment is suitably performed in an $NH_3$ gas atmosphere for 15 to 120 s by setting the substrate temperature between 250° C. and 400° C. By reducing an oxide film under such conditions, Cu—O on the surface of the Cu film 260 can be reduced while leaving Cu—O formed by implanting O in the Cu film 260. In other words, reduction treatment of the surface of the Cu film 260 is performed in such a way that implanted O is not completely removed.

In FIG. 9B, as the upper layer wire formation process (S126), upper layer wires are further formed on the Cu wires. The configuration of the upper layer wires is the same as that in the embodiment 1. Also in FIG. 8B, as in FIG. 4D, only the lower side, which is a portion of the upper layer wire layer, is shown.

Here, while excessive Si when the selective cap film 280 is formed is present near the surface of the Cu film 260, excessive Si when the selective cap film 280 is formed is diffused into the Cu wire 260 by heating treatment generated in one of a series of processes in the upper layer wire formation process (S126). Si enters the Cu wire 260 from the crystal grain boundary of Cu present in the interface between the Cu wire 260 and the selective cap film 280, and diffuses into the Cu wire 260 after passing through the crystal grain boundary. In the embodiment 2, however, the region 292 in which Cu—O is formed is present in the upper parts of the Cu film 260. The region 292 becomes an Si trap layer. Si that has passed through the crystal grain boundary of the Cu film 262 is trapped by Cu—O in the region 292. As described above, when Si moves to Cu—O, a reduction reaction of Cu—O is caused, forming Si—O bonds. For example, Si—O bonds are formed by heating treatment between 200° C. and 400° C. in the upper layer wire formation. Cu—O is reduced by Si to stabilize as Si—O. Thus, as shown in FIG. 9B, the Cu film 260 stabilizes by being changed to a region 294 in which a portion or the whole of Cu—O changes to the Si—O bond. Thus, diffusion of Si into the Cu film 260 below by passing through the region 294 can be suppressed.

In the embodiment 2, as described above, O is implanted in both the broad-width Cu wire A and the minimum-width Cu wires B. As a result, the region 294 in which more Si and O are contained than in other regions is formed in the broad-width Cu wire A. Since it is less likely for Si to diffuse to the minimum-width Cu wires B, as described above, a region 296 in which more Si and O are contained than in other regions, though less compared with the region 294, is formed in the minimum-width Cu wires B.

A semiconductor device according to the embodiment 2, as described above, includes the Cu layer 260 to be Cu wires, the selective cap film 280 selectively formed on the Cu wire and containing Cu and Si, and the inter-level dielectric 220 formed on the side surface side of the Cu wire. The Cu wire of such a semiconductor device has thus the regions 294 and 296 in which more Si and O are contained than in other regions due to Si being trapped by the trap layer. A semiconductor device having the regions 294 and 296 can prevent excessive Si of a compound film formed on the Cu wire and containing Cu and Si from being diffused into the Cu wire. Moreover, since Si—O bonds do not substantially increase wire resistance, the conventional problem of an increase in wire resistance of a Cu wire can be solved. In particular, an effect thereof manifests itself notably in the broad-width Cu wire A.

Embodiments have been described with reference to concrete examples. However, the present invention is not limited to these concrete examples.

The thickness of inter-level dielectrics and the size, shape, number, and the like of openings can also be used by selecting what is needed for semiconductor integrated circuits and various semiconductor elements when necessary.

In addition, all semiconductor devices and methods for fabricating a semiconductor device that have elements of the present invention and whose design can be modified as necessary by persons skilled in the art are included in the scope of the present invention.

While techniques normally used in the semiconductor industry, such as a photolithography process and cleaning before and after treatment, are omitted for convenience of description, it goes without saying that such techniques are included in the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a copper (Cu) wire having a first region and a second region in which densities of silicon (Si) and oxygen (O) atoms are higher than in the first region;
   a compound film that is selectively formed on the Cu wire and contains Cu and Si; and
   a dielectric film formed on a side surface side of the Cu wire.

2. The semiconductor device according to claim 1, wherein the second region is positioned on an upper layer side in the Cu wire.

3. The semiconductor device according to claim 1, wherein the Cu wire having the first region and the second region is defined as a first Cu wire, further comprising:
   a second Cu wire having a wire width narrower than that of the first Cu wire and in which the second region is not formed.

4. The semiconductor device according to claim 3, wherein the compound film is formed on, in addition to the first Cu wire, the second Cu wire selectively.

5. A method for fabricating a semiconductor device, comprising:
   forming a dielectric film above a substrate;
   forming an opening in the dielectric film;
   depositing a first copper (Cu) film up to a midpoint in the opening;
   forming a Cu oxide film on the first Cu film before the opening being filled with the first Cu film;
   forming a second Cu film on the Cu oxide film; and
   forming a compound film containing Cu and silicon (Si) selectively on the second Cu film.

6. The method according to claim 5, wherein when the Cu oxide film is formed, a surface of the first Cu film is exposed to a gas atmosphere containing oxygen or soaked in a liquid containing oxygen.

7. The semiconductor device according to claim 1, wherein a peak density of Si atom is provided in the copper wire when a density profile of Si atom is obtained along a line between a top surface of the copper wire and a bottom surface of the copper wire.

8. The semiconductor device according to claim 1, wherein a peak density of O atom is provided in the copper wire when a density profile of O atom is obtained along a line between a top surface of the copper wire and a bottom surface of the copper wire.

9. The semiconductor device according to claim 1, wherein a region in which a quantity of Si—O bond is greater than that in the second region is provided between the first region and second region of the copper wire.

10. The semiconductor device according to claim 1, wherein a peak density of Si atom is provided in the copper wire when a density profile of Si atom is obtained along a line between a top surface of the copper wire and a bottom surface of the copper wire,
   a peak density of O atom is provided in the copper wire when a density profile of O atom is obtained along a line between a top surface of the copper wore and a bottom surface of the copper wire, and
   the peak density of Si atom and the peak density of O atom are provided in a substantially same position.

11. The method according to claim 5, wherein the second Cu film is formed in such a way that a top of the second Cu film is provided at a higher position than a top of the opening.

12. The method according to claim 5, further comprising: removing the first and second Cu films and the Cu oxide film projecting from the opening after the second Cu film being formed.

13. The method according to claim 12, wherein the compound film is formed after the first and second Cu films and the Cu oxide film projecting from the opening being removed.

14. The method according to claim 5, further comprising: performing reduction treatment of a surface of the second Cu film so as to not reduce an oxygen component of the Cu oxide film positioned below the second Cu film before the compound film being formed.

15. The method according to claim 5, wherein when the opening is formed, if the opening is defined as a first opening, a second opening having a width narrower than that of the first opening is formed together and
   when the first Cu film is deposited, the second opening is completely filled with the first Cu film.

16. The method according to claim 5, wherein when the opening is formed, if the opening is defined as a first opening, a second opening having a width narrower than that of the first opening is formed together and
   the Cu oxide film is formed in the first opening so as to not form the Cu oxide film in the second opening.

17. A method for fabricating a semiconductor device, comprising:
   forming a dielectric film above a substrate;
   forming an opening in the dielectric film;
   depositing a copper (Cu) film in the opening;
   implanting oxygen (O) in the Cu film; and
   forming a compound film containing Cu and silicon (Si) selectively on the Cu film after O being implanted.

18. The method according to claim 17, further comprising: removing the Cu film projecting from the opening after the Cu film being deposited.

19. The method according to claim 18, wherein the O is implanted after the Cu film projecting from the opening being removed.

20. The method according to claim 17, further comprising: performing reduction treatment of a surface of the Cu film so as to not completely remove the implanted O before the compound film being formed.

\* \* \* \* \*